United States Patent
Anim-Appiah et al.

(10) Patent No.: US 7,356,088 B2
(45) Date of Patent: Apr. 8, 2008

(54) M-DIMENSION M-PAM TRELLIS CODE SYSTEM AND ASSOCIATED TRELLIS ENCODER AND DECODER

(75) Inventors: Kofi D. Anim-Appiah, Allen, TX (US); Nirmal C. Warke, Irving, TX (US)

(73) Assignee: Texas Instruments Incorporated, Dallas, TX (US)

( * ) Notice: Subject to any disclaimer, the term of this patent is extended or adjusted under 35 U.S.C. 154(b) by 620 days.

(21) Appl. No.: 10/835,439

(22) Filed: Apr. 29, 2004

(65) Prior Publication Data
US 2005/0243941 A1    Nov. 3, 2005

(51) Int. Cl.
*H04L 23/02* (2006.01)
(52) U.S. Cl. ..................................... 375/265
(58) Field of Classification Search ................. 375/265, 375/341, 295, 316, 268; 714/752, 792; 332/103, 332/149, 151; 455/108; 704/242
See application file for complete search history.

(56) References Cited

U.S. PATENT DOCUMENTS

| | | | | |
|---|---|---|---|---|
| 4,939,555 | A | * | 7/1990 | Calderbank et al. ........ 375/286 |
| 5,448,592 | A | * | 9/1995 | Williams et al. ............ 375/261 |
| 6,769,090 | B1 | * | 7/2004 | Halder .......................... 714/792 |
| 2001/0035994 | A1 | * | 11/2001 | Agazzi et al. ............... 359/152 |
| 2003/0067992 | A1 | * | 4/2003 | Karaoguz et al. ........... 375/265 |
| 2003/0202612 | A1 | * | 10/2003 | Halder et al. ................ 375/265 |
| 2004/0194004 | A1 | * | 9/2004 | Betts ........................... 714/792 |
| 2006/0140287 | A1 | * | 6/2006 | Alon et al. .................. 375/260 |

OTHER PUBLICATIONS

Ungerboeck; "Channel Coding with Multilevel/Phase Signals"; IEEE Transactions on Information Theory, vol. IT-28, No. 1; Jan. 1982; pp. 55-67.
Massey; "Coding and Modulation in Digital Communications"; Proc. 1974 Int. Zurich Seminar on Digital Comm.; Zurich, Switzerland; Mar. 1974; pp. E2(1)-(4).
Forney; "The Viterbi Algorithm"; Proceedings of the IEEE, vol. 61, Mar. 1973; pp. 268-278.

* cited by examiner

*Primary Examiner*—Sam K. Ahn
(74) *Attorney, Agent, or Firm*—Steven A. Shaw; W. James Brady; Frederick J. Telecky, Jr.

(57) ABSTRACT

An M-dimension M-PAM trellis code encoder, a method of encoding user bits and a decoder. In one embodiment, the encoder includes: (1) a convolutional encoder portion configured to encode at least two user bits into at least three coded bits and (2) a sublattice selector coupled to the convolutional encoder portion and configured to employ the at least three coded bits to select a particular sublattice of code alphabet elements and further to employ at least two additional user bits to select a particular code alphabet element in the sublattice.

14 Claims, 3 Drawing Sheets

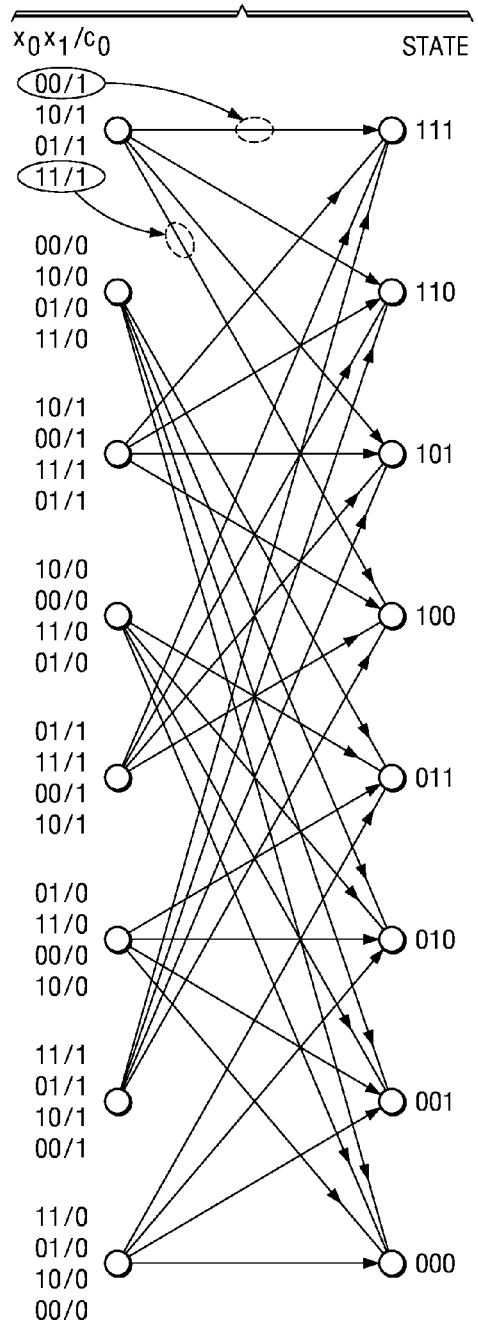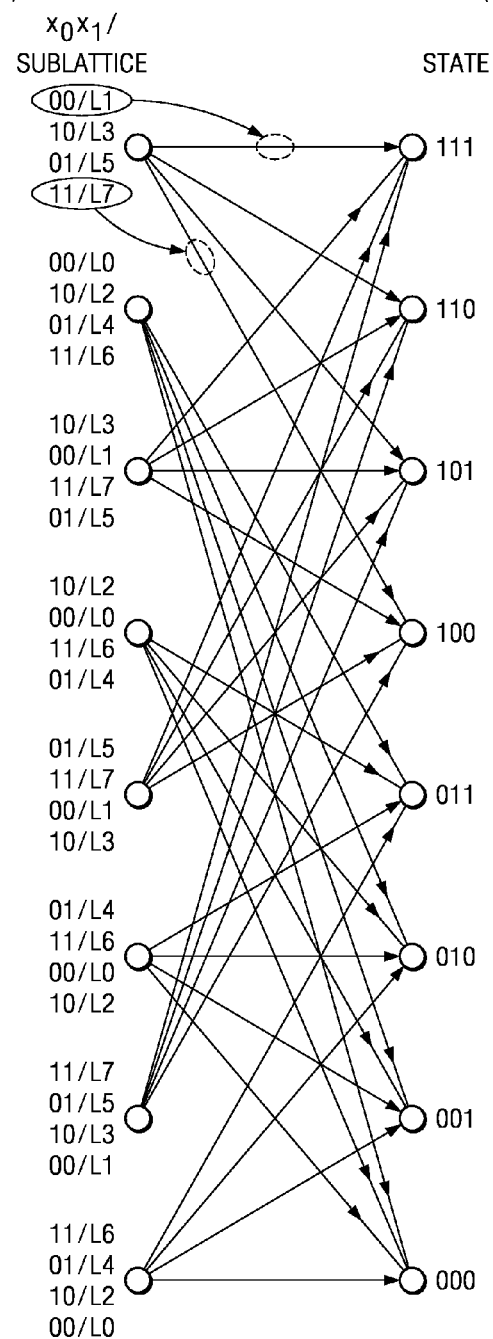

M-DIMENSION M-PAM TRELLIS CODE SYSTEM AND ASSOCIATED TRELLIS ENCODER AND DECODER

TECHNICAL FIELD OF THE INVENTION

The present invention is directed, in general, to data communication systems for general information transmission and, more specifically, to an M-dimension M-ary pulse amplitude modulated (M-PAM) trellis code system and an associated trellis encoder and decoder.

BACKGROUND OF THE INVENTION

As modern data communication systems transmit data at increasingly higher rates, the reliability of the data becomes more difficult to guarantee. Digital communications engineers know that a channel code can be used to improve the reliability of transmitted data. The fundamental idea behind channel coding is to introduce controlled redundancy into the data to be transmitted. This controlled redundancy allows for detection of, and subsequent recovery of some transmission errors. Channel coding is also often referred to as forward error control (FEC) or error control coding (ECC).

Two main methods of channel coding exist: block coding and trellis coding. (Only binary codes will be addressed to simplify the discussion.) Block coding calls for independent blocks of binary date to be encoded into independent codewords, which are themselves blocks of binary symbols (also known as vectors). Therefore, a block encoder input bit stream is sectioned into independent blocks of the same length that the encoder maps onto independent codewords, often also of the same length.

The ratio of the codeword length to the data block length is the "code rate." As an example, the following table describes a simple rate-⅔ block code rate encoder which encodes blocks of two user bits ($d_0 d_1$) into codewords having a lenght of three bits ($c_0 c_1 c_2$):

TABLE 1

A Simple Block Code and Encoder

| $d_0 d_1$ | $c_0 c_1 c_2$ |
|---|---|
| 00 | 000 |
| 01 | 011 |
| 10 | 110 |
| 11 | 101 |

For a block code, the code is the collection of codewords, {000,001,110,101} in the example, while the encoder specifies the mapping of pairs ($d_0 d_1$) to triplets ($c_0 c_1 c_2$). Therefore, by rearranging the rows of Table 1 under "$d_0 d_1$," the encoder is changed, but not the code. Controlled redundancy is introduced into the data pair by a simple encoding rule:

$c_0 = d_0$ $c_1 = d_0 \oplus d_1$ $c_2 = d_1$ where $\oplus$ denotes a binary exclusive OR (XOR) operation. The redundancy gives the code the property that every codeword has even parity, which allows detection (but not correction in this relatively trivial example) of single errors in a codeword.

It is customary when discussing channel coding, to refer to the "coding gain" of a particular code. "Coding gain" can be thought of as the amount by which the transmitter power may be reduced when using the code, relative to that required by the same system without use of the code. In both cases, the system operates at the same bit error rate (BER). Thus coding may be used either to decrease the BER with the same transmitter power or to decrease transmitter power without decreasing the BER. It can be shown that an optimal decoder for the simple block code in Table 1 achieves a coding gain of 1.2 dB in an additive white Gaussian noise (AWGN) channel using 2-PAM modulation at moderate signal-to-noise ratios (SNR).

Another operation performed in a communication system is modulation, which is the selection of distinct electrical or optical waveforms to represent the information to be transmitted. These waveforms are suitable for actual energy transmission over the physical channel. In data communication systems, it is typical to provide only a finite number of waveforms from which the modulator may choose at a given instant. These waveforms can differ in one or more characteristics such as amplitude, phase or frequency.

One particular type of modulation, known as M-Pulse Amplitude Modulation (M-PAM), calls for a modulator to select and transmit one of M waveforms in response to $\log_2 M$ bits. The waveforms differ from one another only in amplitude. It is customary, in discussing M-PAM modulation, to refer only to the different waveform amplitudes using the set of integers $\{A_m\}$ with $A_m = 2m - 1 - M$, $m = 1, 2, \ldots, M$.

$\{A_m\}$ is referred to as the symbol alphabet. The simplest case occurs for M=2 for which the symbol alphabet is $\{-1,+1\}$. For M=4, the corresponding symbol alphabet is $\{-3,-1,+1,+3\}$.

In many data communications systems, the operations of channel coding and modulation are performed independently, with the modulation operation performed subsequent to channel coding. As an example of how this process works, consider the transmission of the information sequence {1,0, 1,1} (groups of binary symbols are underlined to emphasize block boundaries) by first error control encoding using the simple code above and 2-PAM modulation. The output of the channel encoder is the sequence {1,1,0,1,0,1}. This bit sequence is then mapped by the modulator into the channel symbol sequence {+1,+1,−1,+1,−1,+1} using the modulator mapping function:

| Bit Value | Channel Symbol |
|---|---|
| 0 | −1 |
| 1 | +1 |

Trellis coding differs from block coding in two key ways. First, the encoders have memory, which allows the encoder output in response to a particular input block to change with time. Thus, no fixed encoder mapping needs to exist between input bit blocks and output code words. Second, the modulation operation is usually an integral part of the encoder and thus contributes to the effectiveness of the code. One of the earliest references in the technical literature to this combined channel coding modulation is Massey (see, Massey, "Coding and Modulation in Digital Communications," Proc. 1974

Int. Zürich Seminar on Digital Comm., Zürich, Switzerland, pp. E2 (1)-(4), March 1974, incorporated herein by reference)

Ungerboeck (see, Ungerboeck, "Channel Coding with Multilevel Phase Signals," IEEE Trans. Inform. Theory, Vol. IT-28, no. 1, pp. 55-67, January 1982, incorporated herein by reference) is often credited with invention of trellis-coded modulation which is a subclass of trellis codes. A trellis encoder acts on an input bit sequence to produce an output sequence of channel symbols. The codewords are therefore sequences of channel symbols of arbitrary length. The trellis encoder has a memory by virtue of a shift register being part of the encoder.

Whereas block codes usually have specific decoders that depend on the code, trellis codes are usually decoded with a sequence estimator, the most common being the well-known Viterbi algorithm (see, Forney, Jr., "The Viterbi Algorithm," Proc. IEEE, vol. 61, pp. 268-278, March 1973, incorporated herein by reference).

As discussed above, data transmission rates continue to increase. This is especially true for today's multi-gigabit per second serial links. Conventional channel codes, while certainly useful in increasing the effective fidelity of data transmission, could stand further improvement. Accordingly, what is needed in the art is an improved trellis code. More specifically, what is needed in the art is an improved trellis code for M-PAM data transmission systems related and systems and methods for coding and decoding such trellis code.

SUMMARY OF THE INVENTION

We describe an M-dimensional trellis code that results in improved reliability for data transmission systems employing M-PAM. The code structure allows for a very simple encoder, and in addition, simplifies decoding using a sequence estimation algorithm derived from the VA. Both of these properties are especially desirable in high-speed communications systems like serial links.

In one aspect, the present invention provides an encoder. In one embodiment, the encoder includes: (1) a convolutional encoder portion configured to encode at least two user bits into at least three coded bits and (2) a sublattice selector coupled to the convolutional encoder portion and configured to employ the at least three coded bits to select a particular sublattice of code alphabet elements and further to employ at least two additional user bits to select a particular code alphabet element in the sublattice.

In another aspect, the present invention provides a method of encoding user bits. In one embodiment, the method includes: (1) convolutionally encoding at least two user bits into at least three coded bits, (2) employing the at least three coded bits to select a particular sublattice of code alphabet elements and (3) further employing at least two additional user bits to select a particular code alphabet element in the sublattice.

In yet another aspect, the present invention provides a decoder. In one embodiment, the decoder includes: (1) at least two binary quantizers configured to receive and quantize M 1-D M-PAM symbols and (2) a branch metric calculator coupled to the at least two binary quantizers and configured to find a code alphabet element closest in Euclidean distance to the M 1-D M-PAM symbols in each of a plurality of sublattices.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIG. 2 illustrates a schematic diagram of the trellis for the exemplary convolutional encoder portion of FIG. 1;

FIG. 3 illustrates a schematic diagram of a trellis that results from an encoder table, Table 4, below;

DETAILED DESCRIPTION

Figure 1:
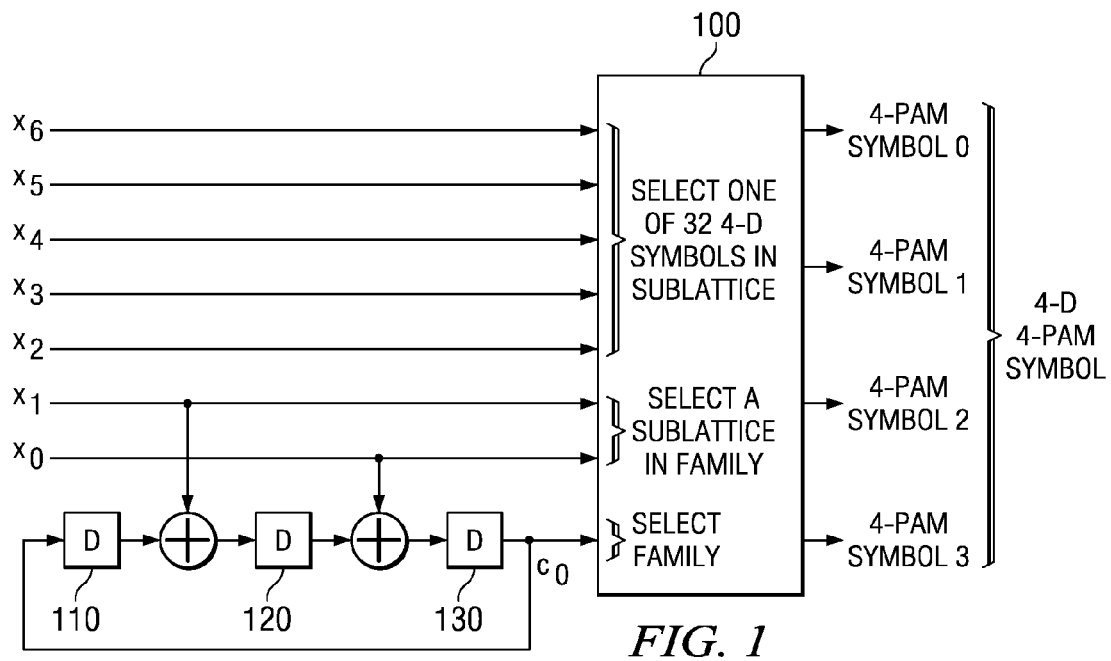
FIG. 1 illustrates a block diagram of one embodiment of a trellis encoder incorporating a rate-⅔ systematic convolutional code constructed according to the principles of the present invention.

The present invention introduces a rate-⅞ M-dimension M-PAM trellis code that, when M=4, achieves an asymptotic coding gain of 5.4 dB in AWGN channels. The code uses a relatively simple encoder. Furthermore, the code structure allows some key simplifications to be made in a Viterbi decoder to decode the code sequences. The specific embodiment to be illustrated and described is a 4-dimension, 4-PAM trellis code, though those skilled in the pertinent art will understand that the principles of the present invention are extensible to more dimensions of code and PAM. The construction of the code will first be described, followed by an encoder employable to generate the code, followed finally by a decoder based on the Viterbi algorithm (VA).

In the illustrated embodiment, the code alphabet C consists of all the 4-vectors of 4-PAM symbols. C thus contains $4^4$=256 unique 4-D symbols. With respect to 4-PAM modulation, the symbol alphabet $\{A_m\}$ is $\{-3,-1,+1,+3\}$. The symbol alphabet is also referred to as the "constellation."

With this convention, the minimum squared Euclidean distance, $d^2_{min}$, between a pair of 4-PAM symbols is four. Note that, for C, $d^2_{min}$=4 also, since C comprises all possible 4-vectors of 4-PAM symbols. C therefore has no inherent coding gain performance advantage.

To obtain coding gain, the set of 256 4-D symbols is partitioned into eight disjoint subsets ("sublattices") of 32 4-D symbols each. Within each sublattice, $d^2_{min}$=16. A rate-⅔ shift-register-based convolutional encoder portion encodes two user bits into three coded bits, which are then used to select a sublattice from which five more user bits select a particular element of the code alphabet. During the encoding process, the convolutional encoder portion successively selects sublattices in such a way that sequences of elements from C also have $d^2_{min}=16$. The sequences of elements from C permitted by the convolutional encoder portion are referred to herein as the trellis code. The code is therefore rate-7/8 (seven user bits are carried by four 4-PAM symbols which ought to carry eight user bits).

Each sublattice can be described in terms of patterns of 4-PAM symbols. To facilitate this description, the 4-PAM constellation is itself partitioned into two subsets, X={−1,+3} and Y={+1,−3}, which is referred to as the 1-D partition. Each element in C can thus be described by exactly one of the 16 "4-D types" obtained by enumerating all 4-tuples of X and Y;

| | | | |
|---|---|---|---|
| XXXX | XYXX | YXXX | YYXX |
| XXXY | XYXY | YXXY | YYXY |
| XXYX | XYYX | YXYX | YYYX |
| XXYY | XYYY | YXYY | YYYY |

Note that since each component of each type (i.e., X or Y) is a binary variable, each type describes exactly $2^4=16$ code symbols. The first step in the 4-D partitioning process is to partition these 16 types into an even family and an odd family. Arbitrarily assigning binary weight 0 to X and binary weight 1 to Y, the even family consists of all eight types with even weight sum; likewise for the odd family. This partitioning generates the largest possible Hamming distance between types in the same family and is matched to the structure of the convolutional encoder portion trellis as will be seen. Thus the two families are:

TABLE 2

Even/Odd Family Partition

| Even Family | Odd Family |
|---|---|
| XXXX | XXXY |
| YYYY | YYYX |
| XYYX | XYYY |
| YXXY | YXXX |
| XXYY | XXYX |
| YYXX | YYXY |
| XYXY | XYXY |
| YXYX | YXXX |

Each family consists of eight 4-D types. The eight types in each family are grouped into four sublattices, each sublattice consisting of a pair of 4-D as follows:

TABLE 2

Even/Odd Family Partition

| Sublattice | 4-D Types | Family |
|---|---|---|
| $L_0$ | XXXXUYYYY | Even |
| $L_1$ | XXXYUYYYX | Odd |
| $L_2$ | XYYXUXXYY | Even |
| $L_3$ | XYYYUYXXX | Odd |
| $L_4$ | XXYYUYYXX | Even |
| $L_5$ | XXYXUYYXY | Odd |
| $L_6$ | XYXYUYXYX | Even |
| $L_7$ | YXYYUXYXX | Odd |

Referring initially to FIG. 1, illustrated is a block diagram of one embodiment of a trellis encoder incorporating a rate-2/3 systematic convolutional code constructed according to the principles of the present invention.

The trellis encoder includes a convolutional encoder portion and a sublattice selector, jointly designated 100. The convolutional encoder portion is configured to encode at least two user bits into at least three coded bits. In the illustrated embodiment, the convolutional encoder portion encodes exactly two user bits, $x_0$ and $x_1$, into exactly three coded bits, $c_0$, $x_0$ and $x_1$. The convolutional encoder portion includes a shift register having delay latches 110, 120, 130 that receive and temporarily store convoluted bit combinations that eventually result in $c_0$.

The sublattice selector is coupled to the convolutional encoder portion (hence their joint designation) and is configured to employ the at least three coded bits to select a particular sublattice of code alphabet elements and further to employ at least two additional user bits to select a particular code alphabet element in the sublattice. In the illustrated embodiment, $c_0$ is used to select a family of sublattices, $x_0$ and $x_1$ are used to select a particular sublattice within the selected family, and $x_2$, $x_3$, $x_4$, $x_5$ and $x_6$ are used to select the particular code alphabet element in the selected sublattice. The convolutional encoder portion and sublattice selector 100 perform these operations in accordance with the above description and further as described below.

Turning now to FIG. 2, illustrated is a schematic diagram of the trellis for the exemplary convolutional encoder portion of FIG. 1. The trellis state is the contents of the shift register (made up of the delay latches 110, 120, 130) in the convolutional encoder portion of FIG. 1. All edges exiting a given state have the same parity bit output $c_0$; the same is true for all edges terminating at a given state. This fact, in concert with the quest for increased $d^2_{min}$ between codeword sequences, is consistent with the parity bit $c_0$ selecting the family. The selection of a sublattice within a particular family is done with the two user bits $x_0$ and $x_1$. This assignment is largely unimportant in achieving increased $d^2_{min}$ due to the symmetry of the trellis. 4-D types with the quartet $L=c_0x_0x_1x_2$ are thus selected according to the following encoder table, Table 4:

TABLE 4

Encoder Table

| | $c_0$ | Family | $x_0x_1$ | $x_2=0$ | $x_2=1$ | Sublattice |
|---|---|---|---|---|---|---|
| 4-D Lattice | 0 ⇒ | Even | 00 ⇒ | XXXX | YYYY | $L_0$ |
| | | | 01 ⇒ | XYYX | YXXY | $L_4$ |
| | | | 10 ⇒ | XXYY | YYXX | $L_2$ |
| | | | 11 ⇒ | XYXY | YXYX | $L_6$ |
| | 1 ⇒ | Odd | 00 ⇒ | XXXY | YYYX | $L_1$ |
| | | | 01 ⇒ | XYYY | YXXX | $L_5$ |
| | | | 10 ⇒ | XXYX | YYXY | $L_3$ |
| | | | 11 ⇒ | YXYY | XYXX | $L_7$ |

Turning now to FIG. 3, illustrated is a schematic diagram of a trellis that results from Table 4.

A full 7-input-bit/4-D-output-symbol labeling of the trellis requires 32 parallel branches in place of each one shown so that the above 32-branch trellis becomes a full 1024-branch trellis. From the viewpoint of hardware implementation, the 32-branch trellis is preferable. However, the 1024-branch trellis is more useful for Monte Carlo simulations, since it allows the VA to be applied in a more straightforward way (see, Forney, Jr., supra).

The selection of the 4-D 4-PAM symbol to be transmitted can be implemented by a lookup table of size $2^4 \times 4$ (amounting to the encoder table in Table 5, below) and a simple computation on the final quartet $x_3x_4x_5x_6$, obviating the need for a full-blown lookup table of size $2^8 \times 8$ addressed by the octet $c_0x_0x_1x_2x_3x_4x_5x_6$. This simple computation is suggested by the observation that, for the 1-D partition, Y=−X.

Computation of the final quartet $x_3x_4x_5x_6$ is as follows (let $z=[z_0z_1z_2z_3]$ be the 4-D symbol, and let $u=[x_3x_4x_5x_6]$):

step i: Compute z=4u−1. This generates a 4-D symbol of type XXXX.

step ii: Look up the prescribed 4-D type using the quartet $1=c_0x_0x_1x_2$. This requires a table of size $2^4 \times 4$.

step iii: For each coordinate i of the prescribed 4-D type where there is a Y, negate the corresponding $z_i$.

As an example, suppose the 7-user-bit encoder input $x_0x_1x_2x_3x_4x_5x_6$=1010110 is encoded into [1,u] =$c_0x_0x_1x_2x_3x_4x_5x_6$=01010110. u=0110, and from step i, the initial z=[−1,3,3,−1]. The prescribed 4-D type, from 1=0101 and the encoder table of Table 4, above, is YYXX. Thus, $z_0$ and $z_1$ are negated to obtain the final z=[1,−3,3,−1].

Figure 4:
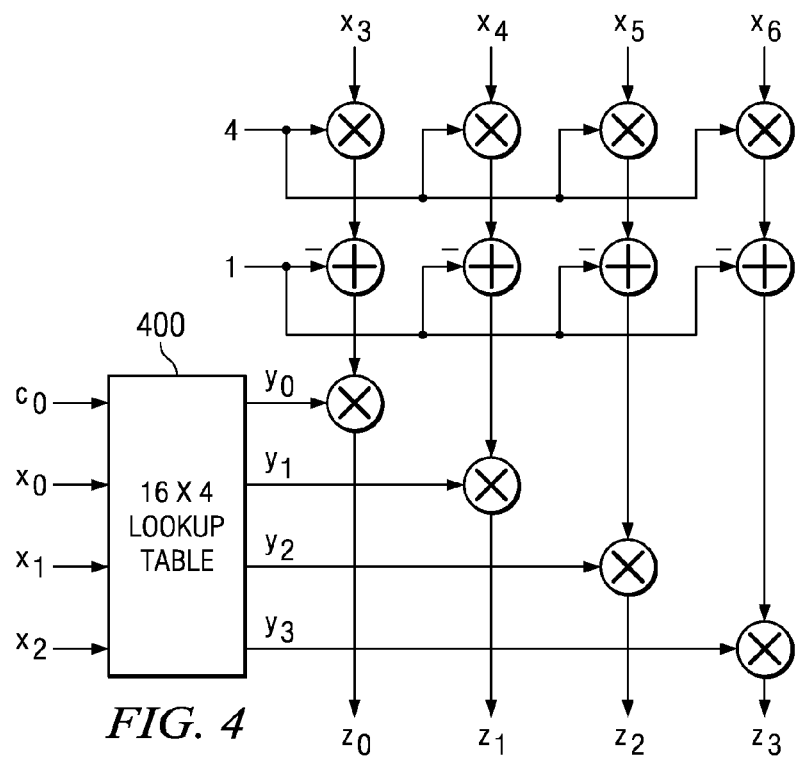
FIG. 4 illustrates various user and coded input bits $c_0 x_0$, $x_1, x_2, x_3, x_4, x_5$ and $x_6$ and final z, consisting of output symbols $z_0$, $z_1$, $z_2$ and $z_3$.

Thus, the trellis encoder can be implemented with relatively simple hardware. An illustration of the mapping of the octet $[1,u]=c_0x_0x_1x_2x_3x_4x_5x_6$ into the final 4-D 4-PAM symbol is shown in FIG. 4. FIG. 4 shows the various user and coded input bits $c_0, x_0, x_1, x_2, x_3, x_4, x_5$ and $x_6$ and final z, consisting of output symbols $z_0$, $z_1$, $z_2$ and $z_3$. The encoder lookup table of size $2^4 \times 4$ referred to above is designated 400.

Table 5, below, sets forth the encoder lookup table 400:

TABLE 5

Encoder Lookup Table for Mapping [1, u] into Final 4-PAM Symbol

| $c_0$ | $x_0$ | $x_1$ | $x_2$ | $y_0$ | $y_1$ | $y_2$ | $y_3$ | $c_0$ | $x_0$ | $x_1$ | $x_2$ | $y_0$ | $y_1$ | $y_2$ | $y_3$ |
|---|---|---|---|---|---|---|---|---|---|---|---|---|---|---|---|
| 0 | 0 | 0 | 0 | +1 | +1 | +1 | +1 | 1 | 0 | 0 | 0 | +1 | +1 | +1 | −1 |
| 0 | 0 | 0 | 1 | −1 | −1 | −1 | −1 | 1 | 0 | 0 | 1 | −1 | −1 | −1 | +1 |
| 0 | 0 | 1 | 0 | +1 | −1 | −1 | +1 | 1 | 0 | 1 | 0 | +1 | −1 | −1 | −1 |
| 0 | 0 | 1 | 1 | −1 | +1 | +1 | −1 | 1 | 0 | 1 | 1 | −1 | +1 | +1 | +1 |
| 0 | 1 | 0 | 0 | +1 | +1 | −1 | −1 | 1 | 1 | 0 | 0 | +1 | +1 | −1 | +1 |
| 0 | 1 | 0 | 1 | −1 | −1 | +1 | +1 | 1 | 1 | 0 | 1 | −1 | −1 | +1 | −1 |
| 0 | 1 | 1 | 0 | +1 | −1 | +1 | −1 | 1 | 1 | 1 | 0 | −1 | +1 | −1 | −1 |
| 0 | 1 | 1 | 1 | −1 | +1 | −1 | +1 | 1 | 1 | 1 | 1 | +1 | −1 | +1 | +1 |

Figure 5:
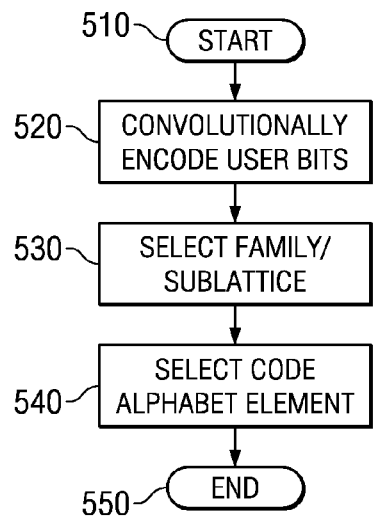
FIG. 5 illustrates a flow diagram of an exemplary method of encoding user bits carried out according to the principles of the present invention.

Having set forth an an exemplary embodiment of an encoder constructed according to the principles of the present invention, an exemplary method of encoding user bits carried out according to the principles of the present invention can now be set forth. Accordingly, turning now to FIG. 5, illustrated is a flow diagram of such method.

The method begins in a start step 510, in which it is desired to encode user bits into M-PAM symbols for transmission, perhaps over a high speed serial link. The method proceeds to a step 520 in which at least two user bits are convolutionally encoded into at least three coded bits.

The method then proceeds to a step 530 in which the at least three coded bits are employed to select a particular sublattice of code alphabet elements. In the illustrated embodiment, this involved selecting a particular family (even/odd) of sublattices and selecting a particular sublattice in the particular family.

The method next proceeds to a step 540 in which at least two additional user bits are employed to select a particular code alphabet element in the sublattice. The method ends in an end step 550 with the transmission of the M-PAM symbols.

While the method disclosed herein has been described and shown with reference to particular steps performed in a particular order, those skilled in the pertinent art will understand that these steps may be combined, subdivided, or reordered to form an equivalent method without departing from the teachings of the present invention. Accordingly, unless specifically indicated herein, the order and grouping of the steps are not limitations of the present invention.

Having set forth an exemplary method of encoding, decoding can now be described. The trellis code can be decoded with a standard sequence estimator such as the VA. When the VA is used, some simplification is possible due to the symmetry in the code structure. In what follows, "4-D baud" k of duration 4T is defined such that 4T separates the beginning of baud k and that of baud k+1, with T being the 1-D (i.e., 4-PAM) symbol duration. The well-known, major steps of Add, Compare and Select (ACS) of the VA will normally be completed within this time. Soft decision decoding is also assumed.

During each 4-D baud, four received noisy 1-D 4-PAM symbols $\{r_i\}_{i=0}^{3}$ are collected. This is the received vector $r=[r_0,r_1,r_2,r_3]$, which is a noisy version of the 4-D symbol transmitted during 4-D baud k. Within each of the eight sublattices, the 4-D 4-PAM vector closest in Euclidean distance to r are then found.

These eight vectors are stored as $\{c_j\}_{j=0}^{7}$.

It is not necessary to perform 32×8 4-D comparisons of squared Euclidean distance between r and each possible 4-D vector to obtain the $\{c_j\}$. Instead, the eight $\{c_j\}$ can be efficiently found by two binary quantizations of each $r_i$: one quantization to X={+3,−1} and the other to Y={−3,+1}. Since the properties of each sublattice are defined in terms of X and Y, the closest 4-D vector to r in each sublattice can be constructed from the eight total binary quantizations of the four $r_i$.

So, for each one of the four $r_i$ collected during 4-D baud k, the two binary quantizations yield $\hat{X}_i$, and $\hat{Y}_i$, respectively ($\hat{X}_i$ is either +3 or −1; $\hat{Y}_i$ is either −3 or +1). As an example, it is known that each of the 32 4-D symbols in sublattice $L_0$ has the form XXXX or YYYY (e.g., [−1+3+3−1] or [+1−3−3+1]). Therefore, to find the closest 4-D symbol to r within $L_0$, only two squared Euclidean distances need to be computed, viz., $$|r-\hat{X}_0\hat{X}_1\hat{X}_2\hat{X}_3|^2 \text{ and } |r-\hat{Y}_0\hat{Y}_1\hat{Y}_2\hat{Y}_3|^2$$

and the smaller chosen.

To summarize, a total of only 16 squared Euclidean distances need to be computed per trellis section. This results in eight 4-D symbols $\{c_j\}$, each of which is in a distinct sublattice and is the closest symbol to r within that sublattice. Due to the code structure, only eight of the 16 squared Euclidean distances are required for updating the state metrics in the ACS routine.

Figure 6:
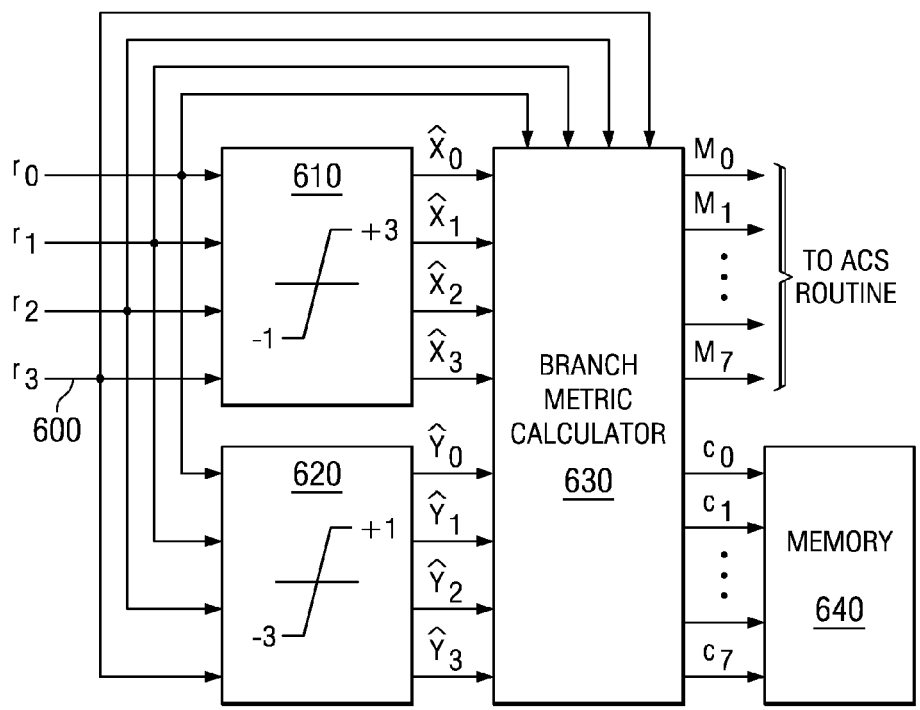
FIG. 6 illustrates a block diagram of an initial section of a trellis decoder for a rate-⅔ systematic convolutional code constructed according to the principles of the present invention.

A block diagram of the initial section of the decoder is shown in FIG. 6. The decoder includes a plurality of input lines 600 configured to receive M 1-D M-PAM symbols representing r. In FIG. 6, as before, M=4. The symbols, $r_0$, $r_1$, $r_2$ and $r_3$, are quantized in first and second binary quantizers 610, 620 to yield $\hat{X}_i$ and $\hat{Y}_i$, respectively.

A branch metric calculator 630 coupled to the first and second binary quantizers 610, 620 is configured to find a code alphabet element closest in Euclidean distance to the quantized M 1-D M-PAM symbols in each of a plurality of sublattices. The resulting eight closest code alphabet elements are stored as $\{c_j\}_{j=0}^7$ in a memory 640. Eight coefficients, $M_0 \ldots M_7$ are provided as required by conventional the VA to update state metrics in the VA decoder ACS routine. Because the remainder of the VA decoder is conventional, it will not be discussed further herein.

Although the present invention has been described in detail, those skilled in the art should understand that they can make various changes, substitutions and alterations herein without departing from the spirit and scope of the invention in its broadest form.

What is claimed is:

1. An encoder, comprising:
   a convolutional encoder portion configured to encode at least two user bits into at least three coded bits, wherein said at least three coded bits includes a parity bit and said at least two user bits; and
   a sublattice selector coupled to said convolutional encoder portion and configured to employ said at least three coded bits to select a particular sublattice of code alphabet element, said particular sublattice is a member of a family of even sublattices or a member of a family of odd sublattices, said sublattice selector configured to employ said parity bit to select between said family of even sublattices and said family of odd sublattices, and further to employ at least two additional user bits to select a particular code alphabet element in said particular sublattice, said particular code alphabet element corresponding to a particular 4-D 4-PAM symbol of a 4-dimension, 4-PAM trellis code.

2. The encoder as recited in claim 1 wherein said sublattice selector is configured to employ three additional user bits to employ a total of five additional user bits to select said particular code alphabet element.

3. The encoder as recited in claim 1 wherein said particular code alphabet element is mapped to said particular 4-D 4-PAM symbol by looking up a first half of said 4-D 4-PAM symbol and employing selected portions of said first half to yield a second half of said 4-D 4-PAM symbol.

4. The encoder as recited in claim 1 wherein said sublattice selector employs said at least two additional user bits with a lookup table to select said particular code alphabet element.

5. The encoder as recited in claim 1 wherein member sublattices of said families of even and odd sublattices are selected to maximize Hamming distances.

6. The encoder as recited in claim 1 wherein dimensions of said code alphabet are divided into 1-D partitions having maximum Hamming distances.

7. The encoder as recited in claim 1 wherein said convolutional encoder portion contains a shift register configured to contain said at least three coded bits.

8. A method of encoding user bits, comprising:
   convolutionally encoding at least two user bits into at least three coded bits, wherein said at least three coded bits includes a parity bit and said at least two user bits;
   employing said at least three coded bits to select a particular sublattice of code alphabet element, wherein said particular sublattice is a member of a family of even sublattices or a member of a family of odd sublattices, said employing further comprises employing said parity bit to select between said family of even sublattices and said family of odd sublattices; and
   further employing at least two additional user bits to select a particular code alphabet element in said particular sublattice, said particular code alphabet element corresponding to a particular 4-D 4-PAM symbol of a 4-dimension, 4-PAM trellis code.

9. The method as recited in claim 8 wherein said further employing comprises further employing a total of five additional user bits to select said particular code alphabet element.

10. The method as recited in claim 8 wherein said particular code alphabet element is mapped to said particular 4-D 4-PAM symbol by looking up a first half of said 4-D 4-PAM symbol and employing selected portions of said first half to yield a second half of said 4-D 4-PAM symbol.

11. The method as recited in claim 8 wherein said employing comprises employing said at least two additional user bits with a lookup table to select said particular code alphabet element.

12. The method as recited in claim 8 wherein member sublattices of said families of even and odd sublattices are selected to maximize Hamming distances.

13. The method as recited in claim 8 wherein dimensions of said code alphabet are divided into 1-D partitions having maximum Hamming distances.

14. The method as recited in claim 8 wherein said convolutionally encoding comprises storing said at least three coded bits in a shift register.

* * * * *